US012408536B2

(12) United States Patent
Kim et al.

(10) Patent No.: US 12,408,536 B2
(45) Date of Patent: Sep. 2, 2025

(54) DISPLAY APPARATUS HAVING A SUBSTRATE HOLE AND METHOD FOR FORMING THE SAME

(71) Applicant: LG Display Co., Ltd., Seoul (KR)

(72) Inventors: Jeong-Oh Kim, Goyang-si (KR); Jei-Hyun Lee, Goyang-si (KR)

(73) Assignee: LG Display Co., Ltd., Seoul (KR)

( * ) Notice: Subject to any disclaimer, the term of this patent is extended or adjusted under 35 U.S.C. 154(b) by 319 days.

(21) Appl. No.: 17/135,450

(22) Filed: Dec. 28, 2020

(65) Prior Publication Data
US 2021/0202569 A1 Jul. 1, 2021

(30) Foreign Application Priority Data
Dec. 31, 2019 (KR) .................. 10-2019-0180185

(51) Int. Cl.
*H10K 59/65* (2023.01)
*H10K 59/122* (2023.01)
*H10K 59/123* (2023.01)
*H10K 59/131* (2023.01)
*H10K 59/80* (2023.01)

(52) U.S. Cl.
CPC .......... *H10K 59/65* (2023.02); *H10K 59/122* (2023.02); *H10K 59/123* (2023.02); *H10K 59/131* (2023.02); *H10K 59/8723* (2023.02); *H10K 59/873* (2023.02)

(58) Field of Classification Search
CPC . H01L 51/5253; H10K 59/873; H10K 50/844
See application file for complete search history.

(56) References Cited

U.S. PATENT DOCUMENTS

| | | | |
|---|---|---|---|
| 9,905,629 B2 | 2/2018 | Kim et al. | |
| 10,135,025 B2 | 11/2018 | Kim et al. | |
| 10,529,952 B2 | 1/2020 | Kim et al. | |
| 10,615,369 B2 | 4/2020 | Choi et al. | |
| 10,714,707 B2 | 7/2020 | Kim et al. | |

(Continued)

FOREIGN PATENT DOCUMENTS

| | | | |
|---|---|---|---|
| CN | 109802052 A | 5/2019 | |
| CN | 110265583 A | 9/2019 | |

(Continued)

OTHER PUBLICATIONS

Korean Intellectual Property Office, Office Action, Korean Patent Application No. 10-2019-0180185, Feb. 20, 2024, eight pages, (with concise explanation of relevance).

(Continued)

*Primary Examiner* — Lauren R Bell
(74) *Attorney, Agent, or Firm* — Fenwick & West LLP

(57) ABSTRACT

A display apparatus is provided. The display apparatus may include a substrate hole penetrating a device substrate. A light-emitting device may be disposed on the device substrate. The light-emitting device may be spaced away from the substrate hole. A separating device may be disposed between the substrate hole and the light-emitting device. The device substrate may be in contact with the device substrate. Thus, in the display apparatus, the permeation of the moisture through the crack of the insulating layer which occurs in a process of forming the substrate hole may be prevented.

16 Claims, 13 Drawing Sheets

(56) References Cited

U.S. PATENT DOCUMENTS

| | | | |
|---|---|---|---|
| RE48,773 E | 10/2021 | Kim et al. | |
| 11,251,401 B2 | 2/2022 | Kim et al. | |
| 11,476,309 B2 | 10/2022 | Ding et al. | |
| 11,737,311 B2 | 8/2023 | Kim et al. | |
| 2017/0148856 A1* | 5/2017 | Choi | H10K 50/844 |
| 2017/0237038 A1 | 8/2017 | Kim et al. | |
| 2017/0288004 A1 | 10/2017 | Kim et al. | |
| 2019/0051859 A1 | 2/2019 | Choi et al. | |
| 2019/0074481 A1 | 3/2019 | Kim et al. | |
| 2020/0144542 A1 | 5/2020 | Kim et al. | |
| 2020/0152663 A1* | 5/2020 | Li | H01L 27/124 |
| 2020/0258960 A1* | 8/2020 | Choi | H10K 50/8445 |
| 2020/0343485 A1 | 10/2020 | Kim et al. | |
| 2021/0028249 A1* | 1/2021 | Ding | H01L 27/1288 |
| 2021/0134848 A1* | 5/2021 | Hanada | H01L 29/7869 |
| 2021/0226163 A1* | 7/2021 | Ji | H10K 71/00 |
| 2022/0028960 A1 | 1/2022 | Kim et al. | |
| 2022/0173356 A1 | 6/2022 | Kim et al. | |
| 2022/0328593 A1* | 10/2022 | Song | H10K 59/87 |
| 2023/0397453 A1 | 12/2023 | Kim et al. | |
| 2024/0023365 A1 | 1/2024 | Choi et al. | |

FOREIGN PATENT DOCUMENTS

| | | |
|---|---|---|
| CN | 110518141 A | 11/2019 |
| KR | 10-2017-0059864 A | 5/2017 |
| KR | 10-2017-0096646 A | 8/2017 |
| KR | 10-2017-0115177 A | 10/2017 |
| KR | 10-2019-0018120 A | 2/2019 |

OTHER PUBLICATIONS

China National Intellectual Property Administration, Office Action, Chinese Patent Application No. 202011537002.6, Dec. 27, 2023, 14 pages.

* cited by examiner

DISPLAY APPARATUS HAVING A SUBSTRATE HOLE AND METHOD FOR FORMING THE SAME

CROSS-REFERENCE TO RELATED APPLICATIONS

This application claims the priority benefit of Republic of Korea Patent Application No. 10-2019-0180185, filed on Dec. 31, 2019, which is hereby incorporated by reference as if fully set forth herein.

BACKGROUND

Field

The present disclosure relates to a display apparatus including a substrate hole which penetrates a device substrate.

Discussion of the Related Art

Generally, an electronic appliance, such as a monitor, a TV, a laptop computer and a digital camera, includes a display apparatus to realize an image. For example, the display apparatus may include a light-emitting device. The light-emitting device may emit light displaying a specific color. For example, the light-emitting device may include a light-emitting layer between a first electrode and a second electrode.

The display apparatus may include a substrate hole in which a peripheral appliance such as a camera, a speaker and a sensor is mounted. The substrate hole may penetrate a device substrate supporting the light-emitting device. The light-emitting device may be spaced away from the substrate hole. A separating device may be disposed between the substrate hole and the light-emitting device. The separating device may cut off an organic layer between the substrate hole and the light-emitting device, partially. For example, the separating device may include an under-cut. The under-cut of the separating device may be formed by the difference of etching ratio between silicon oxide and silicon nitride.

However, in the display apparatus, a crack may be formed in an inorganic insulating layer by a process of forming the substrate hole. Thus, in the display apparatus, external moisture may be permeated through the crack of the inorganic insulating layer.

SUMMARY

Accordingly, the present disclosure is directed to a display apparatus that substantially obviates one or more problems due to limitations and disadvantages of the related art.

An object of the present disclosure is to provide a display apparatus capable of preventing the permeation of the external moisture through the crack which occurs in a process of forming the substrate hole.

Additional advantages, objects, and features of the invention will be set forth in part in the description which follows and in part will become apparent to those having ordinary skill in the art upon examination of the following or may be learned from practice of the invention. The objectives and other advantages of the disclosure may be realized and attained by the structure particularly pointed out in the written description and claims hereof as well as the appended drawings.

To achieve these objects and other advantages and in accordance with the purpose of the disclosure, as embodied and broadly described herein, there is provided a display apparatus comprising a device substrate. A substrate hole penetrates the device substrate. A light-emitting device is disposed on the device substrate. The light-emitting device is spaced away from the substrate hole. A separating device is disposed between the substrate hole and the light-emitting device. The separating device is in contact with the device substrate.

The device substrate may include a recess groove. The separating device may be disposed adjacent the recess groove.

The separating device may include a metal pattern and an insulating cap. The insulating cap may be disposed on the metal pattern.

The metal pattern may have a smaller width than the insulating cap.

A dam may be disposed between the light-emitting device and the separating device. At least one insulating layer may be disposed between the device substrate and the dam.

The dam may have the same stacked structure as the separating device.

An inclined surface of the insulating layer may have a gentler slope than a side surface of the dam and a side surface of the separating device between the dam and the separating device.

A driving circuit may be disposed between the device substrate and the light-emitting device. A connecting electrode connecting may be disposed between the driving circuit and the light-emitting device. The light-emitting device may be connected to the driving circuit by the connecting electrode. The metal pattern may include the same material as the connecting electrode.

BRIEF DESCRIPTION OF THE DRAWINGS

The accompanying drawings, which are included to provide a further understanding of the disclosure and are incorporated in and constitute a part of this application, illustrate embodiment(s) of the invention and together with the description serve to explain the principle of the disclosure.

DETAILED DESCRIPTION OF THE EMBODIMENTS

Figure 1:
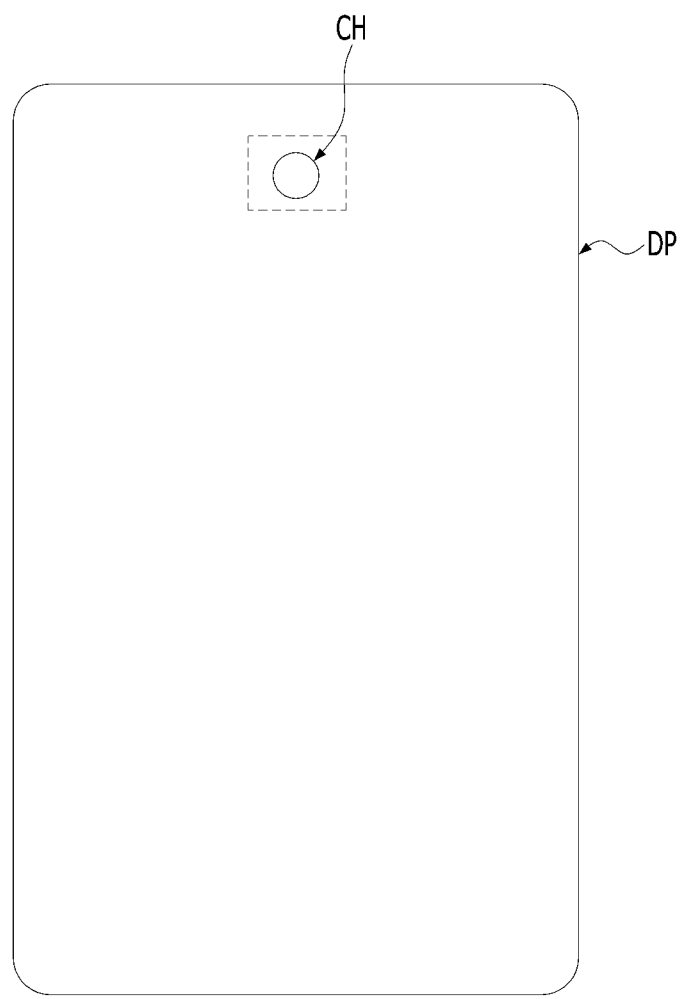
FIG. 1 is a view schematically showing a display apparatus according to an embodiment of the present disclosure.

Hereinafter, details related to the above objects, technical configurations, and operational effects of the embodiments of the present disclosure will be clearly understood by the following detailed description with reference to the drawings, which illustrate some embodiments of the present disclosure. Here, the embodiments of the present disclosure are provided in order to allow the technical sprit of the present disclosure to be satisfactorily transferred to those skilled in the art, and thus the present disclosure may be embodied in other forms and is not limited to the embodiments described below.

In addition, the same or extremely similar elements may be designated by the same reference numerals throughout the specification, and in the drawings, the lengths and thickness of layers and regions may be exaggerated for convenience. It will be understood that, when a first element is referred to as being "on" a second element, although the first element may be disposed on the second element so as to come into contact with the second element, a third element may be interposed between the first element and the second element.

Here, terms such as, for example, "first" and "second" may be used to distinguish any one element with another element. However, the first element and the second element may be arbitrary named according to the convenience of those skilled in the art without departing the technical sprit of the present invention.

The terms used in the specification of the present invention are merely used in order to describe particular embodiments, and are not intended to limit the scope of the present invention. For example, an element described in the singular form is intended to include a plurality of elements unless the context clearly indicates otherwise. In addition, in the specification of the present invention, it will be further understood that the terms "comprises" and "includes" specify the presence of stated features, integers, steps, operations, elements, components, and/or combinations thereof, but do not preclude the presence or addition of one or more other features, integers, steps, operations, elements, components, and/or combinations.

Unless otherwise defined, all terms (including technical and scientific terms) used herein have the same meaning as commonly understood by one of ordinary skill in the art to which example embodiments belong. It will be further understood that terms, such as those defined in commonly used dictionaries, should be interpreted as having a meaning that is consistent with their meaning in the context of the relevant art and should not be interpreted in an idealized or overly formal sense unless expressly so defined herein.

Embodiment

Figure 2:
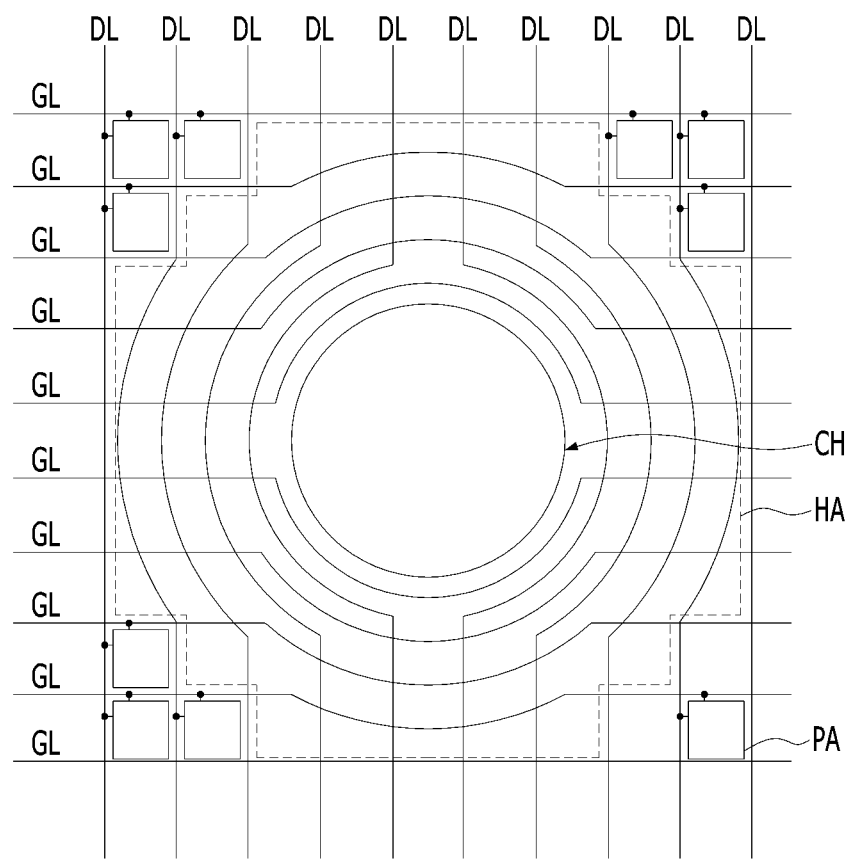
FIG. 2 is an enlarged view showing a peripheral of a substrate hole in the display apparatus according to an embodiment of the present disclosure.
Figure 3A:
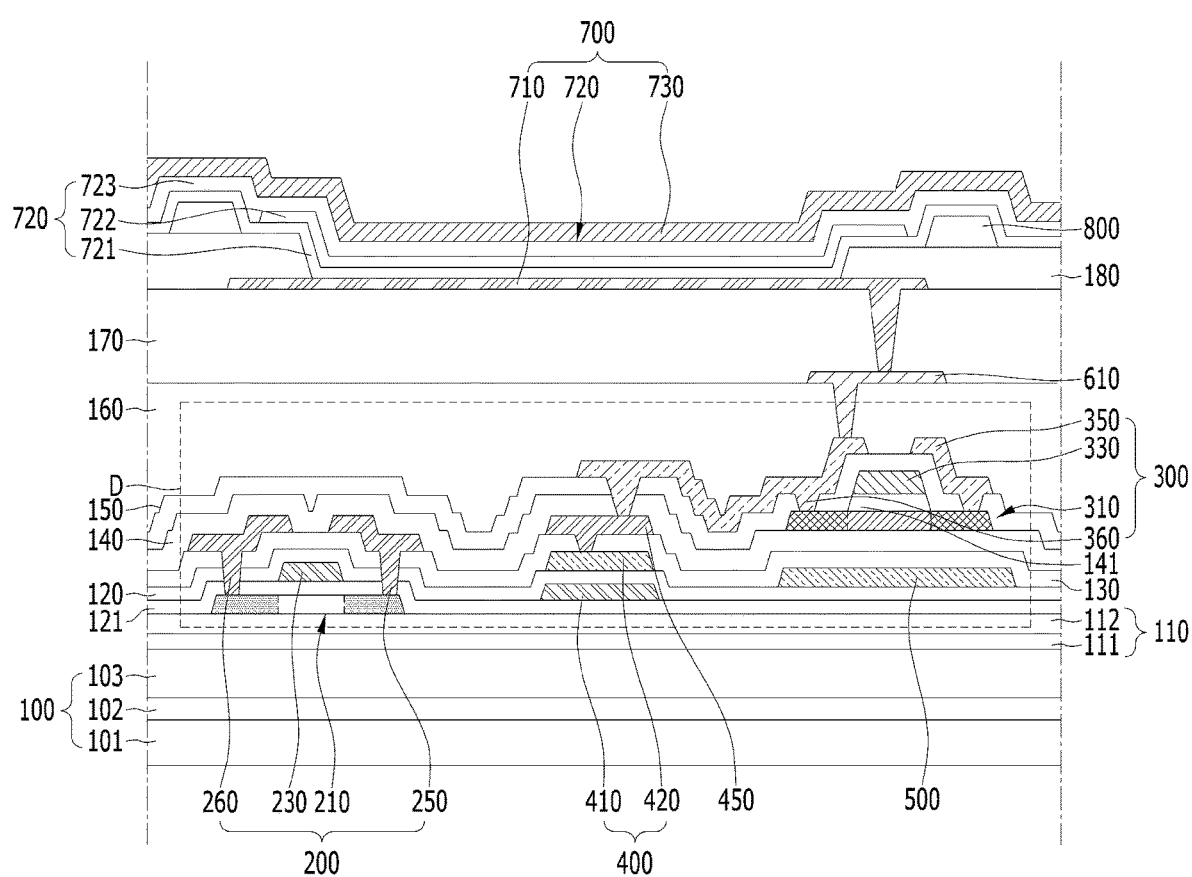
FIG. 3A is a view showing a cross-section of a pixel in the display apparatus according to an embodiment of the present disclosure.
Figure 3B:
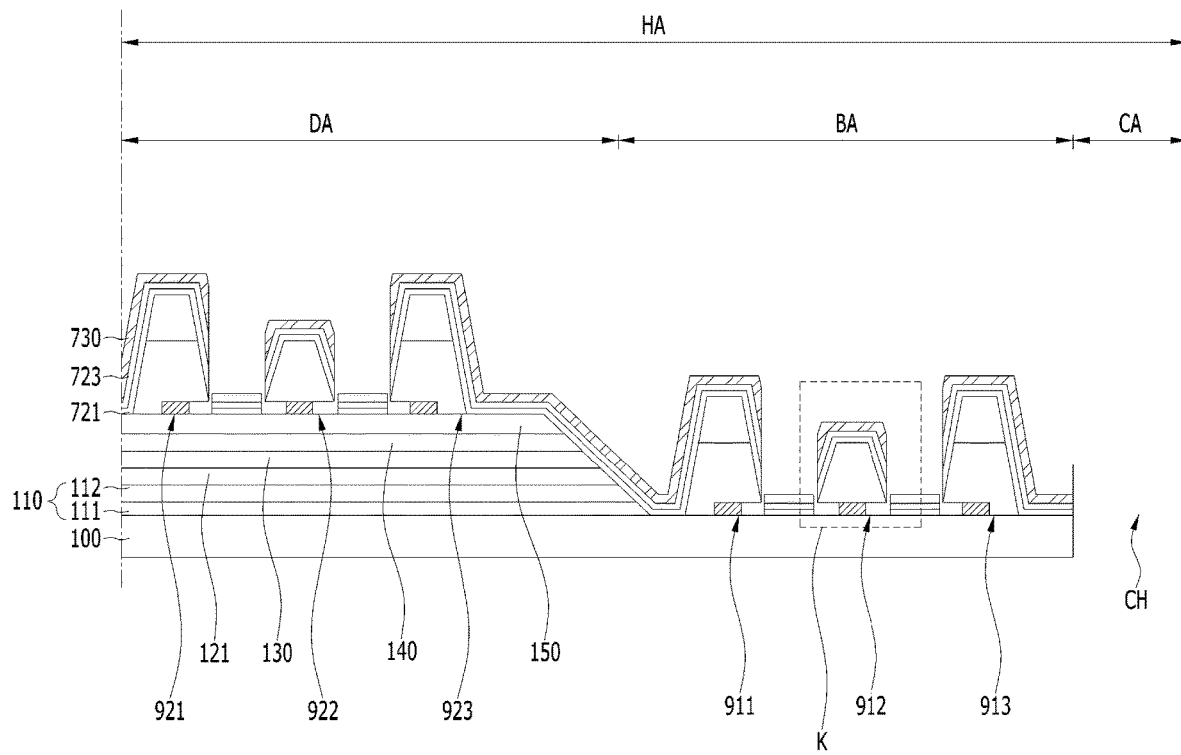
FIG. 3B is a view showing a cross-section of a peripheral region of the substrate hole in the display apparatus according to an embodiment of the present disclosure.
Figure 4:
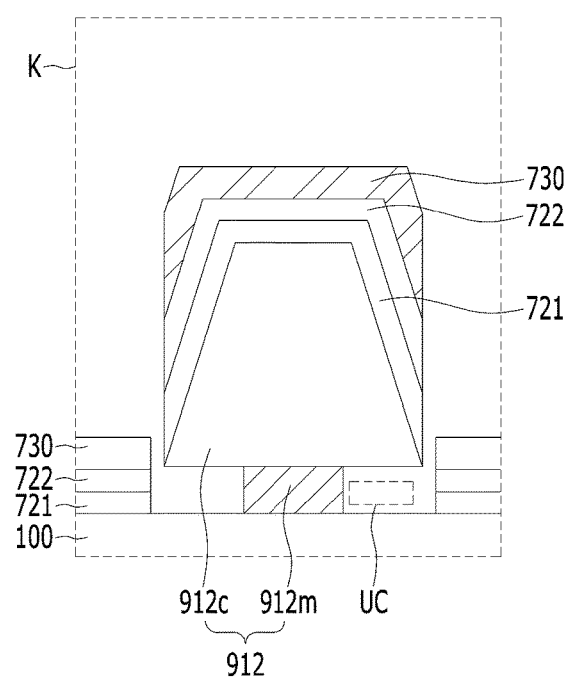
FIG. 4 is an enlarged view of K in FIG. 3B according to an embodiment of the present disclosure.

FIG. 1 is a view schematically showing a display apparatus according to an embodiment of the present disclosure. FIG. 2 is an enlarged view showing a peripheral of a substrate hole in the display apparatus according to the embodiment of the present disclosure. FIG. 3A is a view showing a cross-section of a pixel in the display apparatus according to the embodiment of the present disclosure. FIG. 3B is a view showing a cross-section of a peripheral region of the substrate hole in the display apparatus according to the embodiment of the present disclosure. FIG. 4 is an enlarged view of K in FIG. 3B according to an embodiment of the present disclosure.

Referring to FIGS. 1 to 4, the display apparatus according to the embodiment of the present disclosure may include a device substrate 100. The device substrate 100 may include an insulating material. For example, the device substrate 100 may include glass or plastic.

Gate lines GL and data lines DL may be disposed on the device substrate 100. The data lines DL may intersect the gate lines GL. For example, the gate lines GL and the data lines DL may define a plurality of pixel regions PA.

Each of the pixel regions PA may realize a specific color. For example, a light-emitting device 700 may be disposed in each pixel region PA. The light-emitting device 700 may emit light displaying a specific color. For example, the light-emitting device 700 may include a first electrode 710, a light-emitting layer 720 and a second electrode 730, which are sequentially stacked.

The first electrode 710 may include a conductive material. The first electrode 710 may include a metal having a relatively high reflectance. For example, the first electrode 710 may include a metal, such as aluminum (Al) and silver (Ag). The first electrode 710 may have a multi-layer structure. For example, the first electrode 710 may have a structure in which a reflective electrode formed of a metal is disposed between transparent electrodes formed of a transparent conductive material such as ITO and IZO.

The light-emitting layer 720 may generate light having luminance corresponding to a voltage difference between the first electrode 710 and the second electrode 730. For example, the light-emitting layer 720 may include an emission material. The emission material may include an organic material, an inorganic material or a hybrid material. For example, the display apparatus according to the embodiment of the present disclosure may be an organic light-emitting display apparatus including the light-emitting layer 720 of an organic material.

The light-emitting layer 720 may have a multi-layer structure. For example, the light-emitting layer 720 may include an emission material layer (EML) 722 disposed between a first organic layer 721 and a second organic layer 723. The first organic layer 721 and the second organic layer 723 may include at least one of a hole injection layer (HIL) and a hole transporting layer (HTL), an electron transporting layer (ETL) and an electron injection layer (EIL). Thus, in the display apparatus according to the embodiment of the present disclosure, the emission efficiency of the light-emitting device 700 may be improved.

The second electrode 730 may include a conductive material. The second electrode 730 may include a material different from the first electrode 710. For example, the second electrode 730 may be a transparent electrode formed of a transparent conductive material, such as ITO and IZO. Thus, in the display apparatus according to the embodiment of the present invention, the light generated from the light-emitting layer 720 of each pixel PA may emit outside through the second electrode 730.

A driving circuit D connected to the light-emitting device 700 may be disposed in each pixel region PA. The driving circuit D may supply a driving current corresponding to a gate signal applied by the gate lines GL and a data signal applied by the data line DL to the light-emitting device 700. For example, the driving circuit D may include a first thin film transistor 200, a second thin film transistor 300 and a storage capacitor 400.

The first thin film transistor 200 may turn on/off the second thin film transistor 300 according to the gate signal. The first thin film transistor 200 may include a first semiconductor pattern 210, a first gate electrode 230, a first source electrode 250 and a first drain electrode 260. The first gate electrode 230 may overlap a portion of the first semiconductor pattern 210. A first gate insulating layer 121 may be disposed between the first semiconductor pattern 210 and the first gate electrode 230. The first source electrode 250 and the first drain electrode 260 may connected to the first semiconductor pattern 210.

The first semiconductor pattern 210 may be disposed close to the device substrate 100. The first semiconductor pattern 210 may include a semiconductor material. The first semiconductor pattern 210 may include a poly-silicon. For example, the first semiconductor pattern 210 may include a low-temperature poly silicon (LIPS). The first semiconductor pattern 210 may include a first channel region disposed between a first source region and a first drain region. The first source region and the first drain region may have a higher conductivity than the first channel region. For example, the first source region and the first drain region may have a higher content of conductive impurities than the first channel region.

The first gate insulating layer 121 may be disposed on the first semiconductor pattern 210. The first gate insulating layer 121 may extend beyond the first semiconductor pattern 210. For example, a side surface of the first semiconductor pattern 210 may be covered by the first gate insulating layer 121. The first gate insulating layer 121 may include an insulating material. For example, the first gate insulating layer 121 may include a silicon oxide (SiOx) or silicon nitride (SiNx). The first gate insulating layer 121 may include a material having a high dielectric constant (High-K material). For example, the first gate insulating layer 121 may include hafnium oxide (HfO). The first gate insulating layer 121 may have a multi-layer structure.

The first gate electrode 230 may be disposed on the first gate insulating layer 121. For example, the first gate electrode 230 may overlap the channel region of the first semiconductor pattern 210. The first gate electrode 230 may be insulated from the first semiconductor pattern 210 by the first gate insulating layer 121. The first gate electrode 230 may include a conductive material. For example, the first gate electrode 230 may include a metal, such as aluminum (Al), chromium (Cr), copper (Cu), titanium (Ti), molybdenum (Mo) and tungsten (W). The first gate electrode 230 may be formed of a single layer or a multiple layer.

The first source electrode 250 may be electrically connected to the first source region of the first semiconductor pattern 210. For example, the first source electrode 250 may be in direct contact with a portion of the first source region. The first source electrode 250 may include a portion overlapping with the first source region. The first source electrode may be insulated from the first gate electrode 230. For example, a lower interlayer insulating layer 120 may be disposed on the first gate insulating layer 121 and the first gate electrode 230, and the first source electrode 250 may be disposed on the lower interlayer insulating layer 120. For example, the lower interlayer insulating layer 120 may include silicon oxide (SiOx). The lower interlayer insulating layer 120 may extend beyond the first semiconductor pattern 210. For example, a side surface of the first gate electrode 230 may be in direct contact with the lower interlayer insulating layer 120. The lower interlayer insulating layer 120 may include a first source contact hole partially exposing the first source region of the first semiconductor pattern 210. The first source electrode 250 may be connected to the first source region of the first semiconductor pattern 210 in the first source contact hole.

The first source electrode 250 may include a conductive material. For example, the first source electrode 250 may include a metal, such as aluminum (Al), titanium (Ti), chromium (Cr), molybdenum (Mo), tungsten (W) and copper (Cu) or alloy thereof. The first source electrode 250 may include a material different from the first gate electrode 230.

The first drain electrode 260 may be electrically connected to the first drain region of the first semiconductor pattern 210. For example, the first drain electrode 260 may be in direct contact with a portion of the first drain region. The first drain electrode 260 may include a portion overlapping with the first drain region. The first drain electrode 260 may be insulated from the first gate electrode 230. For example, the first drain electrode 260 may be disposed on the lower interlayer insulating layer 120. The first drain electrode 260 may be spaced away from the first source electrode 250. For example, the lower interlayer insulating layer 120 may include a first drain contact hole partially exposing the first drain region. The first drain electrode 260 may be connected to the first drain region in the first drain contact hole.

The first drain electrode 260 may include a conductive material. For example, the first drain electrode 260 may include a metal, such as aluminum (Al), chromium (Cr), titanium (Ti), molybdenum (Mo), tungsten (W) and copper (Cu), or alloy thereof. The first drain electrode 260 may be formed of a single layer or a multiple layer. The first drain electrode 260 may include the same material as the first source electrode 250. The first drain electrode 260 may include a material different from the first gate electrode 230.

The second thin film transistor 300 may generate a driving current corresponding to the data signal. The second thin film transistor 300 may include a second semiconductor pattern 310, a second gate electrode 330, a second source electrode 350 and a second drain electrode 360. The second gate electrode 330 may overlap a portion of the second semiconductor pattern 310. A second gate insulating layer 141 may be disposed between the second semiconductor pattern 310 and the second gate electrode 330. The second source electrode 350 and the second drain electrode 360 may be connected to the second semiconductor pattern 310.

The second semiconductor pattern 310 may include a material different from the first semiconductor pattern 210. The second semiconductor pattern 310 may be an oxide semiconductor. For example, the second semiconductor pattern 310 may include a metal oxide, such as IGZO.

The second semiconductor pattern 310 may be disposed on a layer different from the first semiconductor pattern 210. For example, an intermediate buffer layer 140 may be disposed between the first semiconductor pattern 210 and the second semiconductor pattern 310. The first semiconductor pattern 210 may be disposed between the device substrate 100 and the intermediate buffer layer 140. The second semiconductor pattern 310 may be disposed on the intermediate buffer layer 140.

The intermediate buffer layer 140 may include silicon nitride (SiNx) or silicon oxide (SiOx). Referring to FIG. 3A, the intermediate buffer layer 140 is illustrated as a single layer, but is not limited thereto. For example, the intermediate buffer layer 140 may be formed of a multiple layer in which a layer including silicon nitride (SiNx) and a layer including silicon oxide (SiOx) are stacked.

The second semiconductor pattern 310 may have the same configuration as the first semiconductor pattern 210. For example, the second semiconductor pattern 310 may include a second channel region disposed between a second source region and a second drain region. An electrical conductivity of the second source region and an electrical conductivity of the second drain region may be higher than an electrical conductivity of the second channel region. For example, the second source region and the second drain region may be a conductorized region.

The second gate insulating layer 141 may be disposed on the second semiconductor pattern 310. For example, the second gate insulating layer 141 may overlap the second channel region of the second semiconductor pattern 310. The second source region and the second drain region of the second semiconductor pattern 310 may be disposed outside the second gate insulating layer 141. The second gate insulating layer 141 may include an insulating material. For example, the second gate insulating layer 320 may include silicon oxide (SiOx) or silicon nitride (SiNx). The second gate insulating layer 141 may include a material having a high dielectric constant (High-K material). For example, the second gate insulating layer 141 may include hafnium oxide (HfO). The second gate insulating layer 141 may have a multi-layer structure. The second gate insulating layer 141 may have the same stacked structure as the first gate insulating layer 121.

The second gate electrode 330 may be disposed on the second gate insulating layer 141. The second gate electrode 330 may overlap the second channel region of the second semiconductor pattern 310. The second gate electrode 330 may be insulated from the second semiconductor pattern 310 by the second gate insulating layer 141. The second channel region of the second semiconductor pattern 310 may have an electrical conductivity corresponding to a voltage applied to the second gate electrode 330. For example, the second channel region of the second semiconductor pattern 310 may be a semiconductor region.

The second gate electrode 330 may include a conductive material. For example, the second gate electrode 330 may include a metal, such as aluminum (Al), chromium (Cr), titanium (Ti), molybdenum (Mo), tungsten (W) and copper (Cu). The second gate electrode 330 may have a single layer or a multiple layer. The second gate electrode 330 may include the same material as the first gate electrode 230.

The second source electrode 350 may be electrically connected to the second source region of the second semiconductor pattern 310. For example, the second source electrode 350 may be in direct contact with a portion of the second source region. The second source electrode 350 may be insulated from the second gate electrode 330. For example an upper interlayer insulating layer 150 may be disposed on the second semiconductor pattern 310 and the second gate electrode 330, and the second source electrode 350 may be disposed on the upper interlayer insulating layer 150. The upper interlayer insulating layer 150 may include an insulating material. For example, the upper interlayer insulating layer 150 may include silicon oxide (SiOx). The upper interlayer insulating layer 150 may extend beyond the second semiconductor pattern 310. For example, a side surface of the second gate electrode 330 may be in direct contact with the upper interlayer insulating layer 150. The upper interlayer insulating layer 150 may include a second source contact hole partially exposing the second source region of the second semiconductor pattern 310. The second source electrode 350 may be connected to the second source region of the second semiconductor pattern 310 in the second source contact hole.

The upper interlayer insulating layer 150 may include silicon nitride (SiNx) or silicon oxide (SiOx). Referring to FIG. 3A, the upper interlayer insulating layer 150 is illustrated as a single layer, but is not limited thereto. For example, the upper interlayer insulating layer 150 may have a multi-layer structure in which a layer formed of silicon nitride (SiNx) and a layer formed of silicon oxide (SiOx) are stacked.

The second source electrode 350 may include a conductive material. For example, the second source electrode 350 may include a metal, such as aluminum (Al), chromium (Cr), titanium (Ti), molybdenum (Mo), tungsten (W) and copper (Cu). The second source electrode 350 may have a single layer or a multiple layer. The second source electrode 350 may include the same material as the first source electrode 250.

The second drain electrode 360 may be electrically connected to the second drain region of the second semiconductor pattern 310. For example, the second drain electrode 360 may be in direct contact with a portion of the second drain region. The second drain electrode 360 may be insulated from the second gate electrode 330. For example, the second drain electrode 360 may be disposed on the upper interlayer insulating layer 150. The upper interlayer insulating layer 150 may include a second drain contact hole partially exposing the second drain region of the second semiconductor pattern 310. The second drain electrode 360 may connected to the second drain region of the second semiconductor pattern 310 in the second drain contact hole.

The second drain electrode 360 may include a conductive material. For example, the second drain electrode 360 may include a metal, such as aluminum (Al), chromium (Cr), titanium (Ti), molybdenum (Mo), tungsten (W) and copper (Cu). The second drain electrode 360 may have a single layer or a multiple layer. The second drain electrode 360 may include the same material as the second source electrode 350. The second drain electrode 360 may include a material different from the second gate electrode 330.

The storage capacitor 400 may be formed by a process of forming the first thin film transistor 200 and the second thin film transistor 300. For example, the storage capacitor 400 may include a first storage electrode 410 disposed on the same layer as the first gate electrode 230, and a second storage electrode 420 above the first storage electrode 410.

The first storage electrode 410 may include a conductive material. The first storage electrode 410 may include a metal, such as aluminum (Al), chromium (Cr), titanium (Ti), molybdenum (Mo), tungsten (W) and copper (Cu). The first storage electrode 410 may have a single layer or a multiple layer. The first storage electrode 410 may include the same material as the first gate electrode 230.

The second storage electrode 420 may include a conductive material. The second storage electrode 420 may include a metal, such as aluminum (Al), chromium (Cr), titanium (Ti), molybdenum (Mo), tungsten (W) and copper (Cu). The second storage electrode 420 may have a single layer or a multiple layer. The lower interlayer insulating layer 120 may extend between the first storage electrode 410 and the second storage electrode 420. The second storage electrode 420 may be disposed on the lower interlayer insulating layer 120. The first source electrode 250 and the first drain electrode 260 may be disposed a layer different from the second storage electrode 420. For example, an intermediate interlayer insulating layer 130 may be disposed on the second storage electrode 420, and the lower interlayer insulating layer 120 and the intermediate interlayer insulating layer 130 may be stacked between the first gate electrode 230 and the first source electrodes 250, and between the first gate electrode 230 and the first drain electrode 260. The second storage electrode 420 may include a material different from the first source electrode 250 and the first drain electrode 260.

The intermediate interlayer insulating layer 130 may include an insulating material. For example, the intermediate interlayer insulating layer 130 may include silicon oxide (SiOx) and/or silicon nitride (SiNx). The intermediate interlayer insulating layer 130 may have a single layer or a multiple layer. For example, the intermediate interlayer insulating layer 130 may have a multi-layer structure in which an insulating layer formed of silicon oxide (SiOx) and an insulating layer formed of silicon nitride (SiNx) are stacked.

The second storage electrode 420 may be electrically connected to the second drain electrode 360 of the second thin film transistor 300. For example, a storage connecting electrode 450 penetrating the intermediate interlayer insulating layer 130 may be disposed on the intermediate interlayer insulating layer 130. The storage connecting electrode 450 may be disposed on the same layer as the first source electrode 250 and the first drain electrode 260. For example, the storage connecting electrode 450 may include the same material as the first source electrode 250 and the first drain electrode 260. The second drain electrode 360 may be connected to the storage connecting electrode 450 by penetrating the intermediate buffer layer 140 and the upper interlayer insulating layer 150.

A light-blocking electrode 500 may be disposed between the lower interlayer insulating layer 120 and the intermediate interlayer insulating layer 130. The light-blocking electrode 500 may prevent the characteristics change of the second semiconductor pattern 310 due to the external light. For example, the light-blocking electrode 500 may include a metal. The light-blocking electrode 500 may include the same material as the second storage electrode 420. For example, the light-blocking electrode 500 may be disposed on the same layer as the second storage electrode 420.

A device buffer layer 110 may be disposed between the device substrate 100 and the driving circuit D of each pixel region PA. The device buffer layer 110 may prevent pollution from the device substrate 100 during a process of forming the driving circuits D. For example, the device buffer layer 110 may extend between the device substrate 100 and the first semiconductor pattern 210 of each pixel region PA. The device buffer layer 110 may include an insulating material. For example, the device buffer layer 110 may include silicon oxide (SiOx) and/or silicon nitride (SiNx). The device buffer layer 110 may have a multi-layer structure. For example, the device buffer layer 110 may have a stacked structure of a first buffer layer 111 and a second buffer layer 112 including a material different from the first buffer layer 111.

A first over-coat layer 160 and a second over-coat layer 170 may be sequentially stacked between the driving circuit D and the light-emitting device 700 of each pixel region PA. The first over-coat layer 160 may remove a thickness difference due to the driving circuit D of each pixel region PA. The second over-coat layer 170 may be disposed on the first over-coat layer 160. A surface of the second over-coat layer 170 toward the light-emitting device 700 of each pixel region PA may be a flat surface. The first over-coat layer 160 and the second over-coat layer 170 may include an insulating material. The first over-coat layer 160 and the second over-coat layer 170 may include a material different from the upper interlayer insulating layer 150. For example, the first over-coat layer 160 and the second over-coat layer 170 may include an organic insulating material. The second over-coat layer 170 may include a material different from the first over-coat layer 160, but is not limited thereto.

The light-emitting device 700 of each pixel region PA may be electrically connected to the second thin film transistor 300 of the corresponding pixel region PA. For example, the first electrode 710 of each pixel region PA may be electrically connected to the corresponding second drain electrode 360 by penetrating the first over-coat layer 160 and the second over-coat layer 170. The first electrode 710 of each pixel region PA may be electrically connected to the corresponding second drain electrode 360 by an intermediate electrode 610. For example, the intermediate electrode 610 may be disposed between the first over-coat layer 160 and the second over-coat layer 170. The intermediate electrode 610 may be connected to the second drain electrode 360 by penetrating the first over-coat layer 160, and the first electrode 710 may be connected to the intermediate electrode 610 by penetrating the second over-coat layer 170.

The intermediate electrode 610 may include a conductive material. For example, the intermediate electrode 610 may include a metal, such as aluminum (Al), chromium (Cr), titanium (Ti), molybdenum (Mo), tungsten (W) and copper (Cu), or alloy thereof. The intermediate electrode 620 may have a single layer or a multiple layer.

The light-emitting device 700 of each pixel region PA may be independently operated. For example, the first electrode 710 of each pixel region PA may be insulated from the first electrode 710 of adjacent pixel region PA. An edge of each first electrode 710 may be covered by a bank insulating layer 180. The bank insulating layer 180 may be disposed on the second over-coat layer 170. The light-emitting layer 720 and the second electrode 730 of each pixel region PA may be stacked on a portion of the corresponding first electrode 710 exposed by the bank insulating layer 180. The bank insulating layer 180 may include an insulating material. For example, the bank insulating layer 180 may include an organic insulating material. The bank insulating layer 180 may include a material different from the second over-coat layer 170.

At least a portion of the light-emitting layer 720 of each pixel region PA may extend onto the bank insulating layer 180. For example, the first organic layer 721 and the second organic layer 723 of each pixel region PA may be connected to the first organic layer 721 and the second organic layer 723 of adjacent pixel region PA. The emission material layer 722 of each pixel region PA may be spaced away from the emission material layer 722 of adjacent pixel region PA. For example, the emission material layer 722 of each pixel region PA may be formed by a deposition process using a fine metal mask (FMM). A spacer 800 may be disposed on the bank insulating layer 180. The spacer 800 may prevent damage of adjacent emission material layer 722 and/or the bank insulating layer 180 due to the fine metal mask. For example, the end of each emission material layer 722 may be disposed on a surface of the bank insulating layer 180 which is disposed outside the spacer 800. The spacer 800 may include an insulating material.

The second electrode 730 of each pixel region PA may extend onto the bank insulating layer 180. For example, the second electrode 730 of each pixel region PA may be connected to the second electrode 730 of adjacent pixel region PA.

A substrate hole CH may be formed in the device substrate 100. The substrate hole CH may penetrate the device substrate 100. The substrate hole CH may be disposed among the pixel regions PA. For example, the substrate hole CH may be formed among the light-emitting devices 700. The device substrate 100 may include a hole peripheral region HA including a region in which the substrate hole CH is formed. The light-emitting devices 700 may be disposed outside the hole peripheral region HA. The gate lines GL and the data lines DL may be bypassed along an edge of the substrate hole CH in the hole peripheral region HA.

The hole peripheral region HA may include a penetrating region CA in which the substrate hole CH is formed, a separating region BA surrounding the penetrating region CA, and a dam region DA disposed outside the separating region BA. The separating region BA may be disposed between the penetrating region CA and the dam region DA. For example, the separating region BA may be disposed between the substrate hole CH and the light-emitting devices 700.

A separating device 911, 912 and 913 may be disposed in the separating region BA. The separating device 911, 912 and 913 may be in direct contact with the device substrate 100. For example, an insulating layer formed in the separating region BA may be removed. Thus, in the display apparatus according to the embodiment of the present disclosure, a crack which occurs in a process of forming the substrate hole CH may be blocked in the separating region BA. Therefore, in the display apparatus according to the embodiment of the present disclosure, the permeation of moisture due to the process of forming the substrate hole CH may be prevented.

The separating device 911, 912 and 913 may have a structure in which a metal pattern 912*m* and an insulating cap 912*c* are stacked. The metal pattern 912*m* may have a smaller width than the insulating cap 912*c*. For example, an under-cut UC may be formed between the device substrate 100 and the insulating cap 921*c*. Thus, in the display apparatus according to the embodiment of the present disclosure, the organic and/or inorganic layer deposited after the formation of the separating device 911, 912 and 913 may be separated by the separating device 911, 912 and 913. For example, the first organic layer 721, the second organic layer 723 and the second electrode 730 may be partially cut off by the separating device 911, 912 and 913.

The separating device 911, 912 and 913 may have various shapes. For example, at least one separating device 912 may have a shape in which the under-cut is formed at a left lower end and a right lower end of the insulating cap 912*c*. And, at least one separating device 911 and 913 may have a shape in which the insulating cap extends beyond one side of the metal pattern. Thus, the display apparatus according to the embodiment of the present disclosure may effectively block the permeation of the external moisture using the separating device 911, 912 and 913 having various shapes.

The metal pattern 912*m* may include the same material as the intermediate electrode 610. For example, the metal pattern 912*m* may have the same stacked structure as the intermediate electrode 610.

A dam 921, 922 and 923 may be disposed in the dam region DA. At least one insulating layer 121, 130, 140 and 150 may be stacked between the device substrate 100 and the dam 921, 922 and 923. The dam 921, 922 and 923 may have the same structure as the separating device 911, 912 and 913. For example, at least one dam 922 may have a shape in which a metal pattern and an insulating cap are sequentially stacked, and an under-cut is formed at a left lower end and a right lower end of the insulating cap. And, at least one dam 921 and 923 may have a shape in which a metal pattern and an insulating cap are sequentially stacked, and the insulating cap extends beyond one side of the metal pattern. Thus, the display apparatus according to the embodiment of the present disclosure may effectively block the permeation of the external moisture using the separating device 911, 912 and 913, and the dam 921, 922 and 923 which have various shapes.

FIGS. 5A to 10A and 5B to 10B are views sequentially showing a method of forming the display apparatus according to the embodiment of the present disclosure.

Figure 5A:
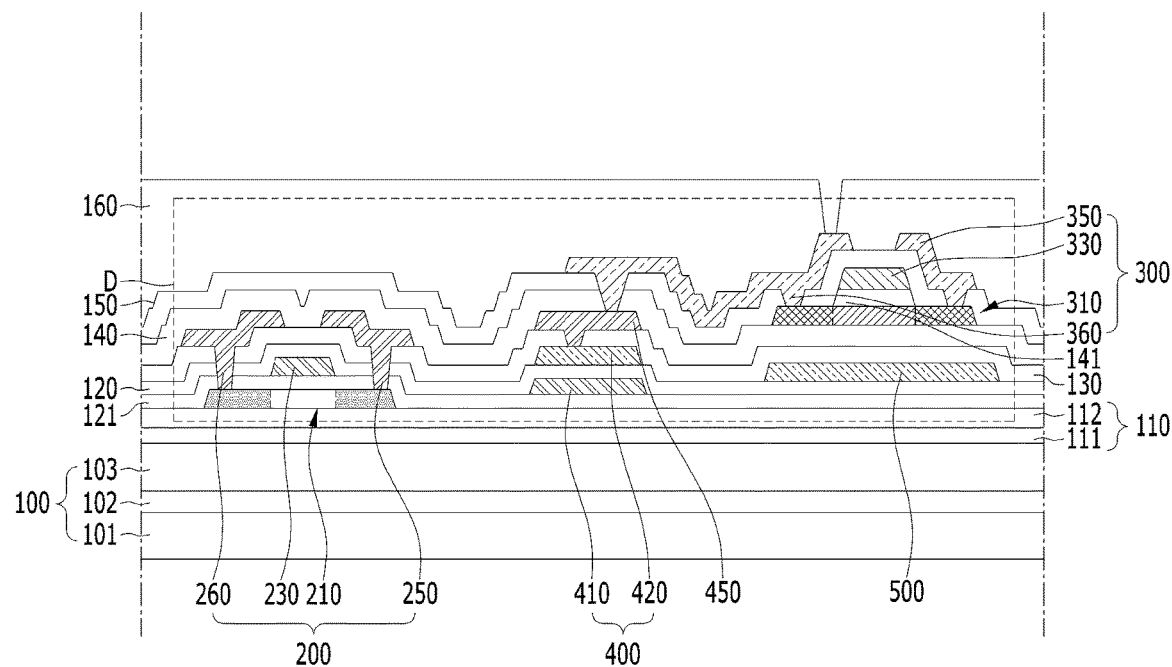
FIGS. 5A, 6A, 7A, 8A, 9A, and 10A and FIGS. 5B, 6B, 7B, 8B, 9B, and 10B are views sequentially showing a method of forming the display apparatus according to an embodiment of the present disclosure.
Figure 5B:
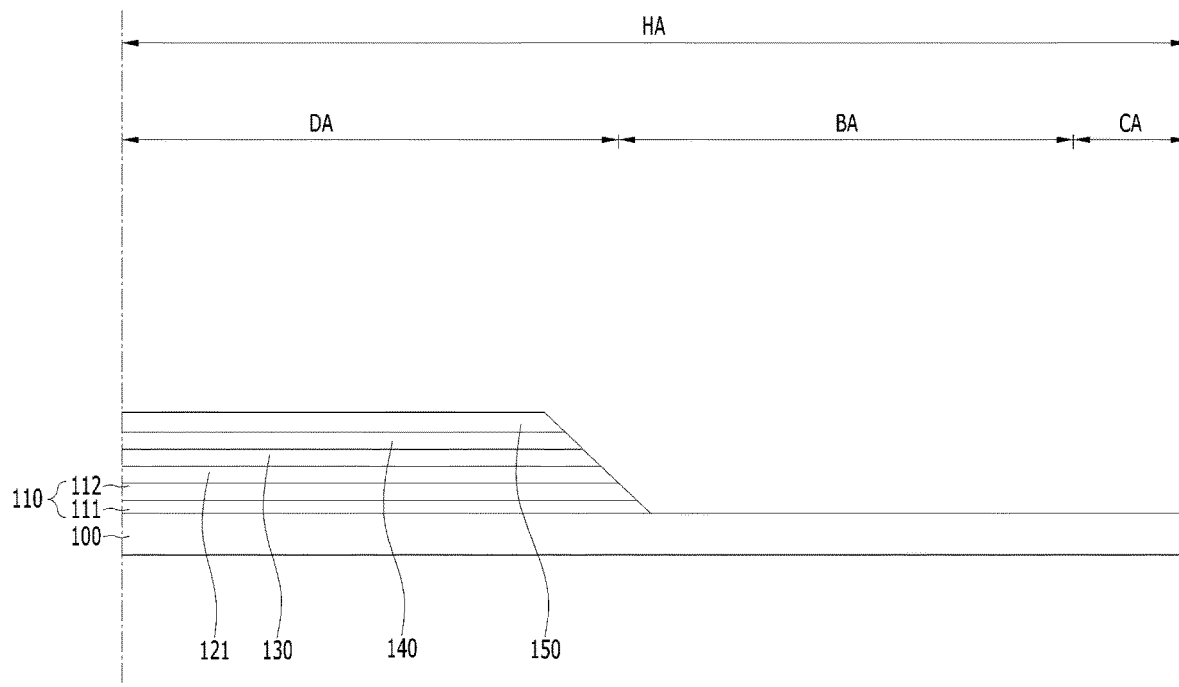

A method of forming the display device according to the embodiment of the present disclosure will be described with reference to FIGS. 3A, 3B, 5A to 10A and 5B to 10B. First, as shown in FIGS. 5A and 5B, the method of forming the display apparatus according to the embodiment of the present disclosure may include a step of forming a driving circuit D on each pixel region PA of the device substrate 100, a step of forming the first over-coat layer 160 covering the driving circuits D, and a step of removing an insulating layer which is disposed on the separating region BA and the penetrating region CA.

The step of removing the insulating layer in the separating region BA and the penetrating region CA may be performed relatively gently between the dam region DA and the separating region BA due to a difference in density. For example, insulating layers 121, 130, 140 and 150 stacked on the dam region DA may include a side surface toward the penetrating region CA, and the side surface of the insulating layers 121, 130, 140 and 150 toward the penetrating region CA may have a gentle inclination.

Figure 6A:
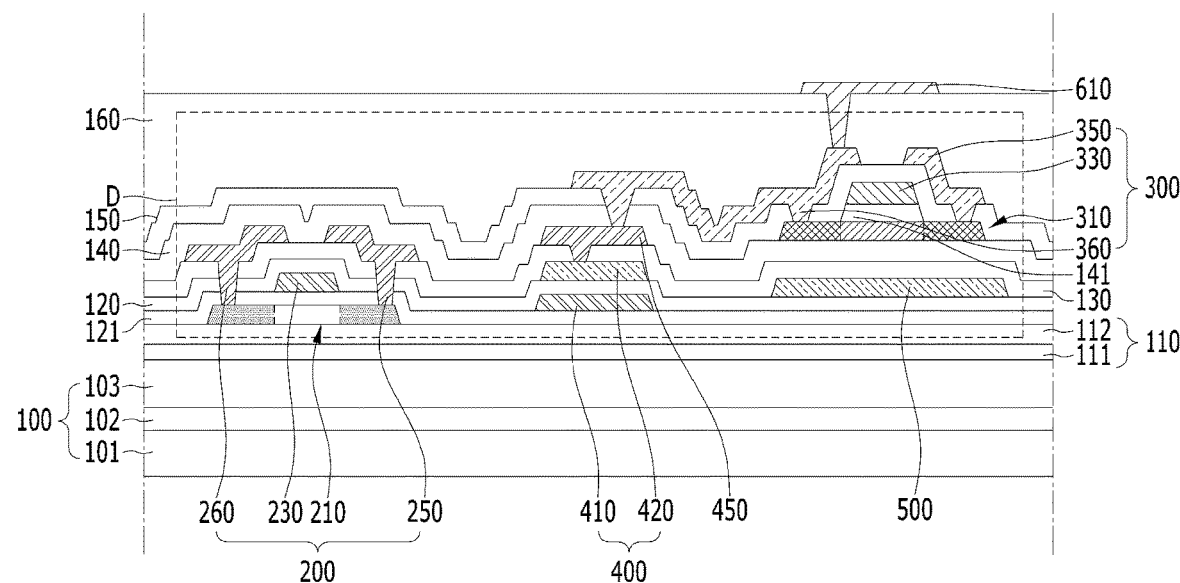
Figure 6B:
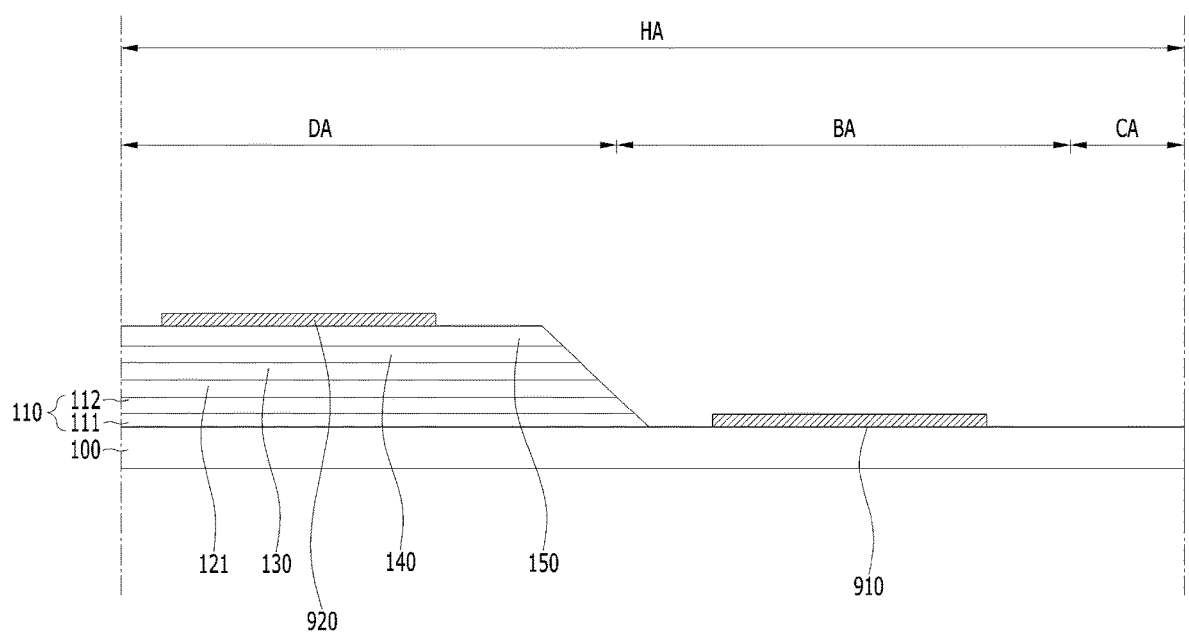

As shown in FIGS. 6A and 6B, the method of forming the display apparatus according to the embodiment of the present disclosure may include a step of forming the intermediate electrode 610 on the first over-coat layer 160, a step of forming a first preliminary pattern 910 on the separating region BA, and a step of forming a second preliminary pattern 920 on the dam region DA.

The first preliminary pattern 910 and the second preliminary pattern 920 may be formed simultaneously with the intermediate electrode 610. For example, a step of forming the intermediate electrode 610, the first preliminary pattern 910 and the second preliminary pattern 920 may include a step of forming a conductive material layer on the first over-coat layer 160, and a step of patterning the conductive material layer. Thus, in the method of forming the display apparatus according to the embodiment of the present invention, the intermediate electrode 610, the first preliminary pattern 910 and the second preliminary pattern 920 may be formed of the same material.

Figure 7A:
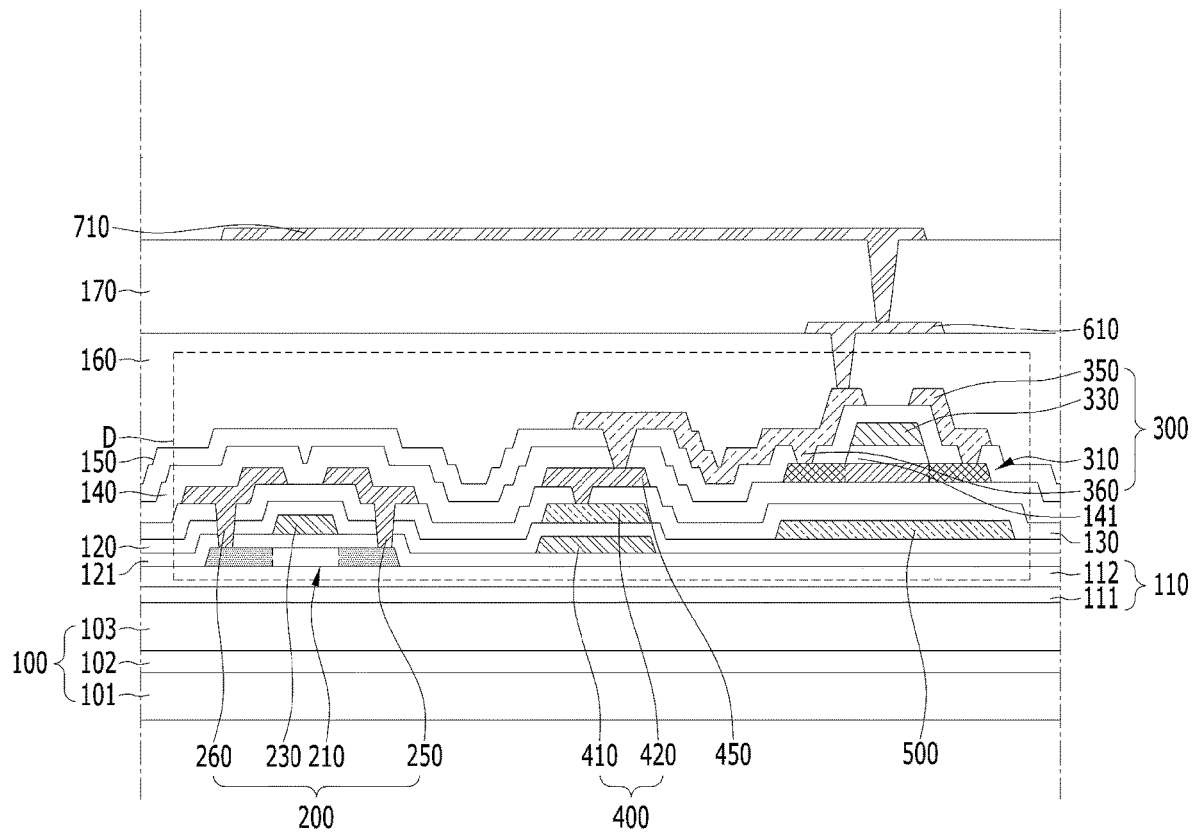
Figure 7B:
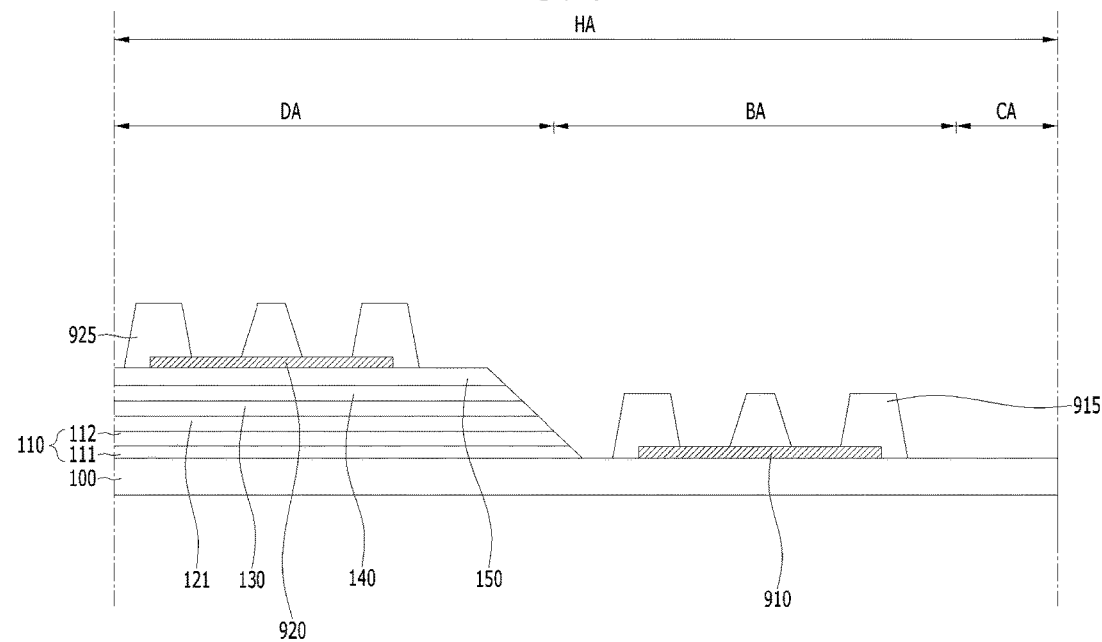

As shown in FIGS. 7A and 7B, the method of forming the display apparatus according to the embodiment of the present disclosure may include a step of forming the second over-coat layer 170 on the intermediate electrode 610, the first preliminary pattern 910 and the second preliminary pattern 920, a step of forming a first preliminary cap 915 on the first preliminary pattern 910, a step of forming a second preliminary cap 925 on the second preliminary pattern 920, and a step of forming the first electrode 710 connected to the intermediate electrode 610 on the second over-coat layer 170.

The first preliminary cap 915 and the second preliminary cap 925 may be formed by using the second over-coat layer 170. For example, the step of forming the first preliminary cap 915 and the second preliminary cap 925 may include a step of partially etching the second over-coat layer 170 on the separating region BA and the dam region DA. The second preliminary cap 925 may be formed of the same material as the first preliminary cap 915.

The first preliminary cap 915 may partially expose the first preliminary pattern 910. The second preliminary cap 925 may partially expose the second preliminary pattern 920. For example, the location of the first preliminary cap 915 based on the first preliminary pattern 910 may correspond to the location of the second preliminary cap 925 based on the second preliminary pattern 920.

Figure 8A:
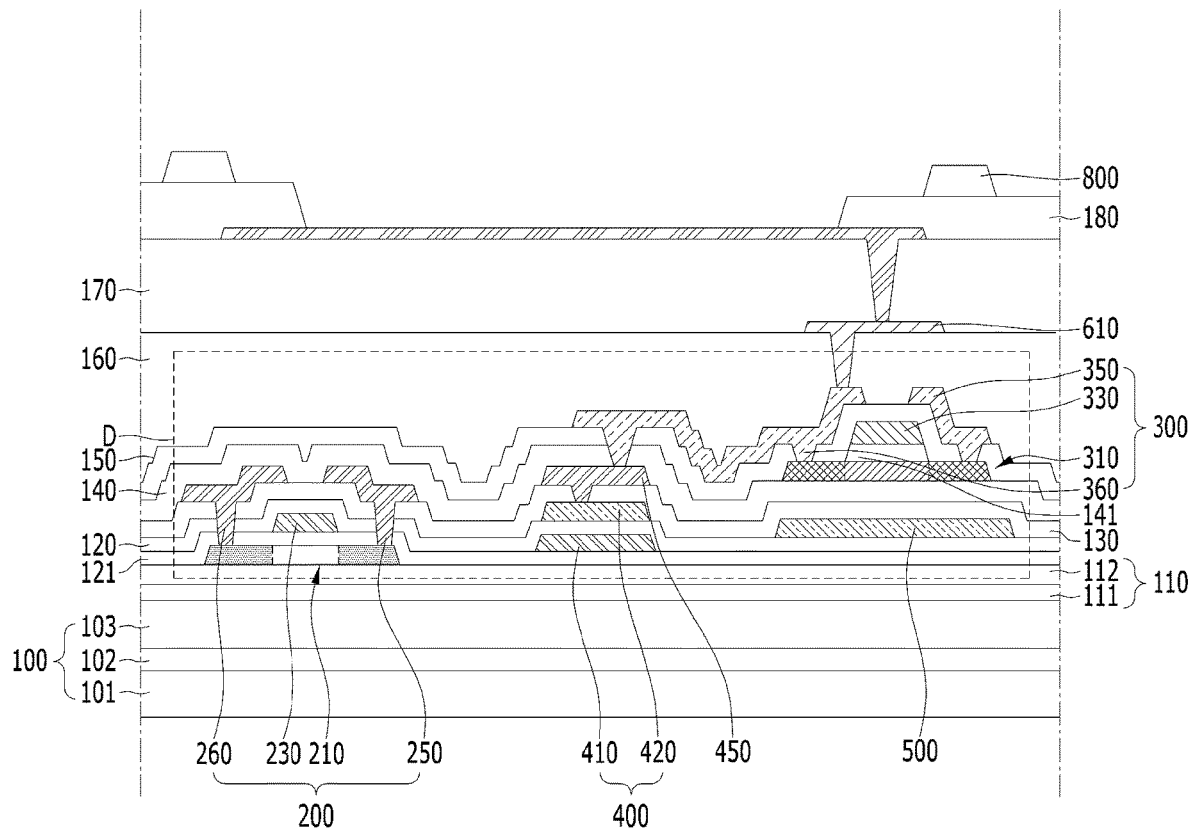
Figure 8B:
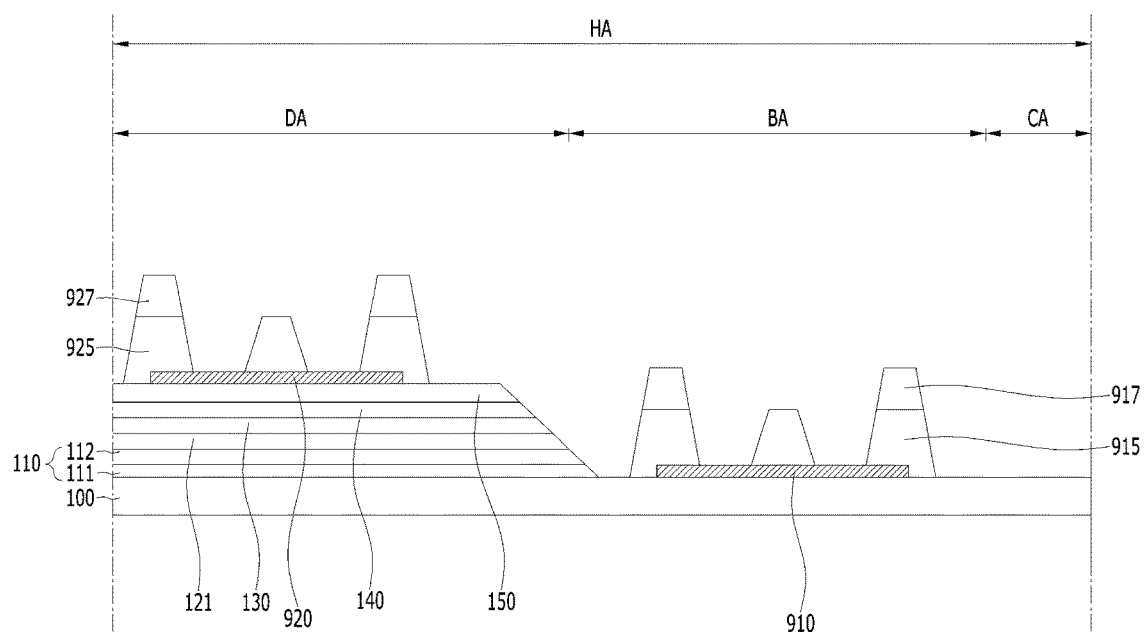

As shown in FIGS. 8A and 8B, the method of forming the display apparatus according to the embodiment of the present disclosure may include a step of forming the bank insulating layer 180, the spacer 800, a first upper cap 917 and a second upper cap 927 on the device substrate 100 in which the first electrode 710 of each pixel region PA is formed.

The bank insulating layer 180 may cover the edge of the first electrode 710 of each pixel region PA. The spacer 800 may be formed on the bank insulating layer 180. The first upper cap 917 may be formed on the first preliminary cap 915. The second upper cap 927 may be formed on the second preliminary cap 925.

The first upper cap 917 and the second upper cap 927 may be formed by using a process of forming the bank insulating layer 180 and the spacer 800. For example, the step of forming first upper cap 917 and the second upper cap 927 may include a step of stacking insulating layers for forming the bank insulating layer 180 and the spacer 800, and a step of patterning the insulating layers. The second upper cap 927 may be formed of the same material as the first upper cap 917. For example, the first upper cap 917 and the second upper cap 927 may be formed simultaneously with the bank insulating layer 180 and/or the spacer 800.

Figure 9A:
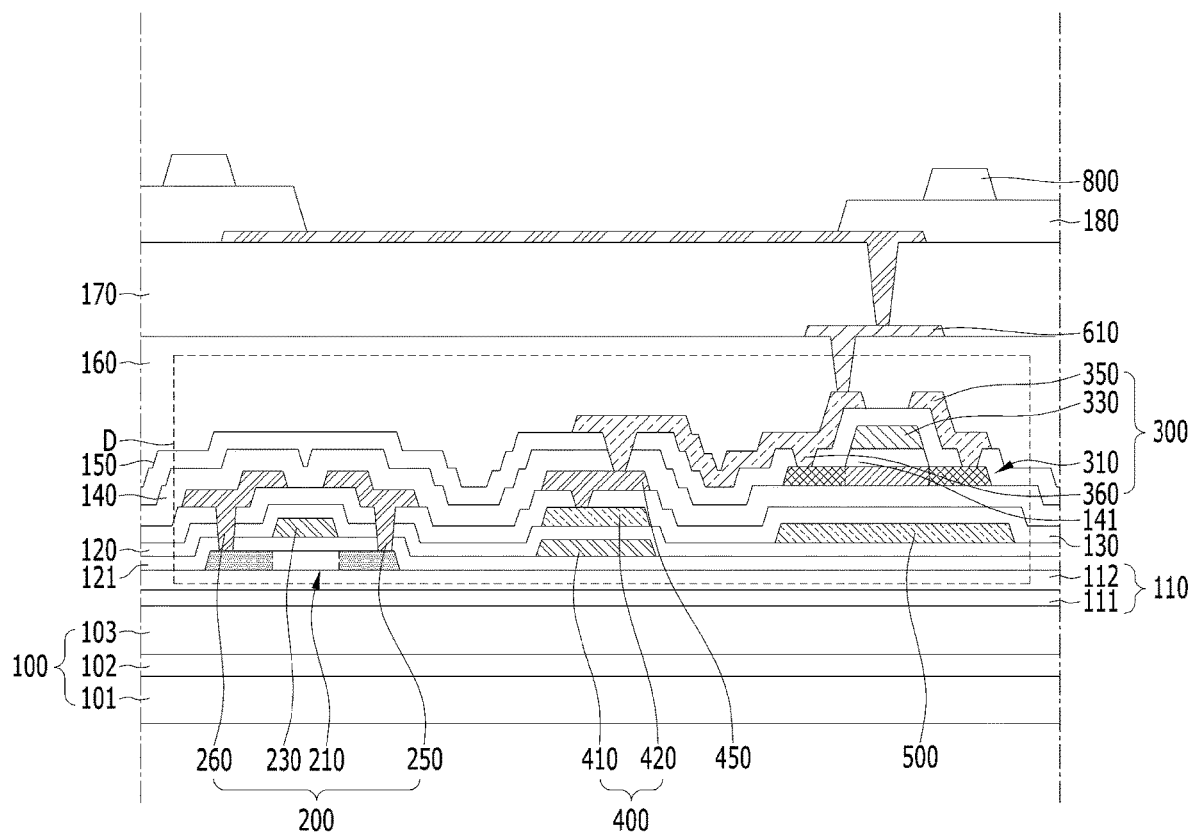
Figure 9B:
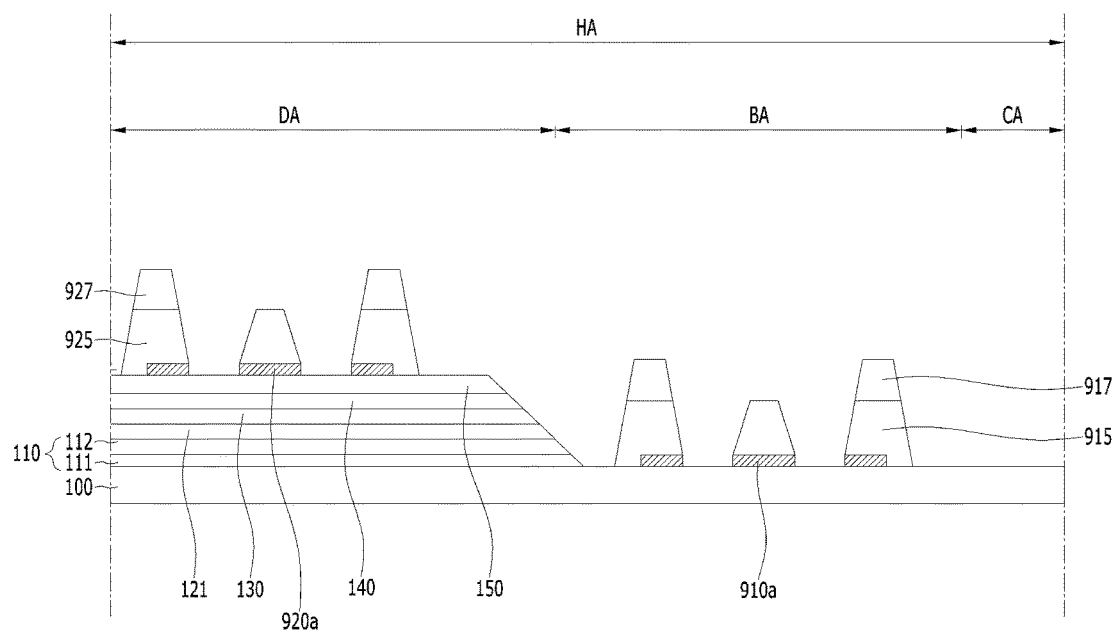

As shown in FIGS. 9A and 9B, the method of forming the display apparatus according to the embodiment of the present disclosure may include a step of removing a portion of the first preliminary pattern 910 exposed by the first preliminary cap 915 and the first upper cap 917, and a step of removing a portion of the second preliminary pattern 920 exposed by the second preliminary cap 925 and the second upper cap 927.

The step of removing a portion of the second preliminary pattern 920 may be performed simultaneously with the step of removing a portion of the first preliminary pattern 910. For example, the step of removing a portion of the second preliminary pattern 920 and a portion of the first preliminary pattern 910 may include a step of etching the first preliminary pattern 910 and the second preliminary pattern 920 using the first upper cap 917 and the second upper cap 927 as an etching mask. A first preliminary metal pattern 910a overlapping with the first preliminary cap 915 and a second preliminary metal pattern 920a overlapping with the second preliminary cap 925 may be formed by the process of etching the first preliminary pattern 910 and the second preliminary pattern 920.

Figure 10A:
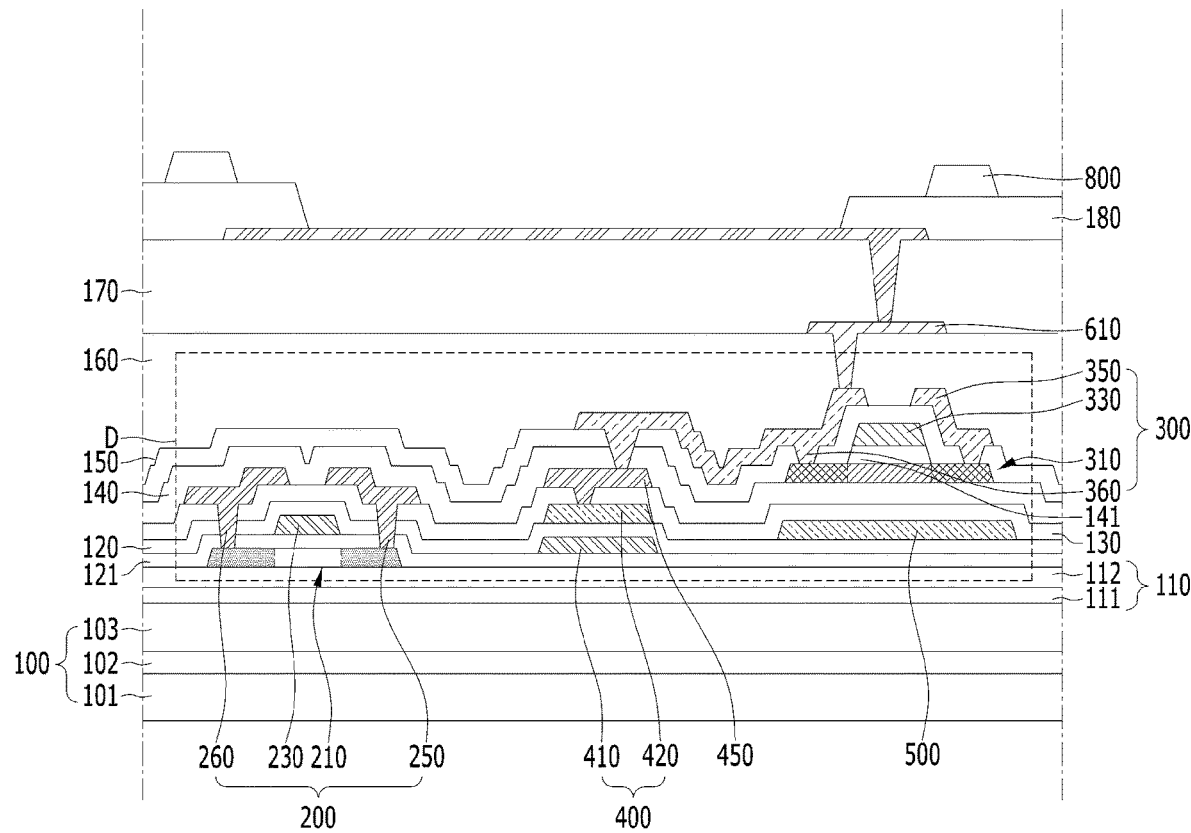
Figure 10B:
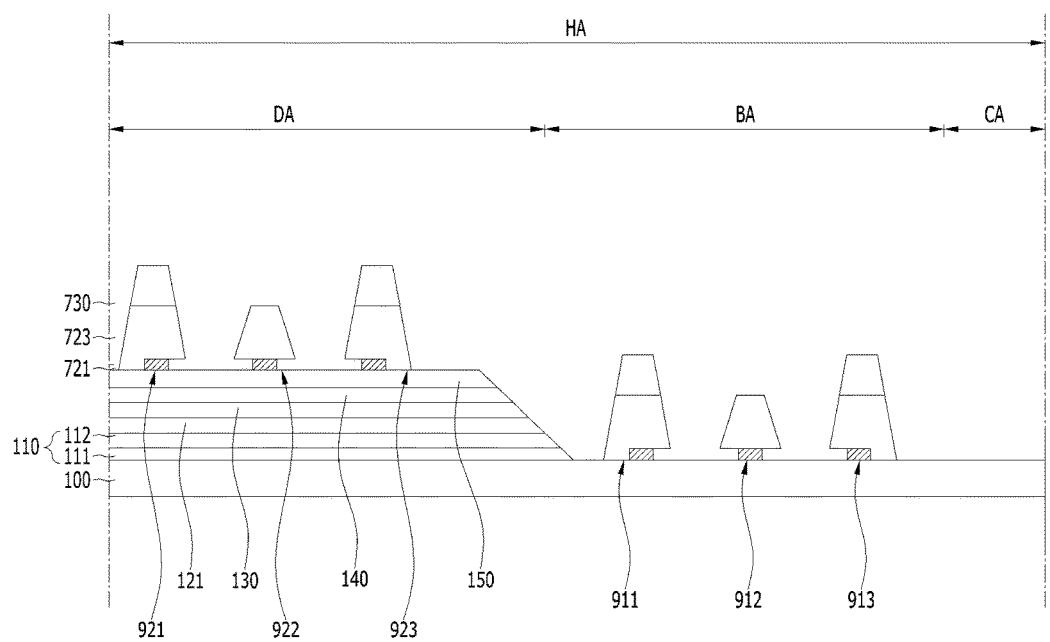

As shown in FIGS. 10A and 10B, the method of forming the display apparatus according to the display apparatus according to the embodiment of the present disclosure may include a step of forming the separating device 911, 912 and 913 on the separating region BA and the dam 921, 922 and 923 on the dam region DA.

The step of forming the separating device 911, 912 and 913, and the dam 921, 922 and 923 may include a step of reducing a width of the first preliminary metal pattern 910a and the second preliminary metal pattern 920a. Thus, in the display apparatus according to the embodiment of the present disclosure, the separating device 911, 912 and 913 and the dam 921, 922 and 923 may include the metal pattern and the insulating cap having a larger width than the metal pattern, which are stacked. That is, in the display apparatus according to the embodiment of the present disclosure, each of the separating device 911, 912 and 913 and the dam 921, 922 and 923 may include the under-cut due to a difference in width.

Figure 11A:
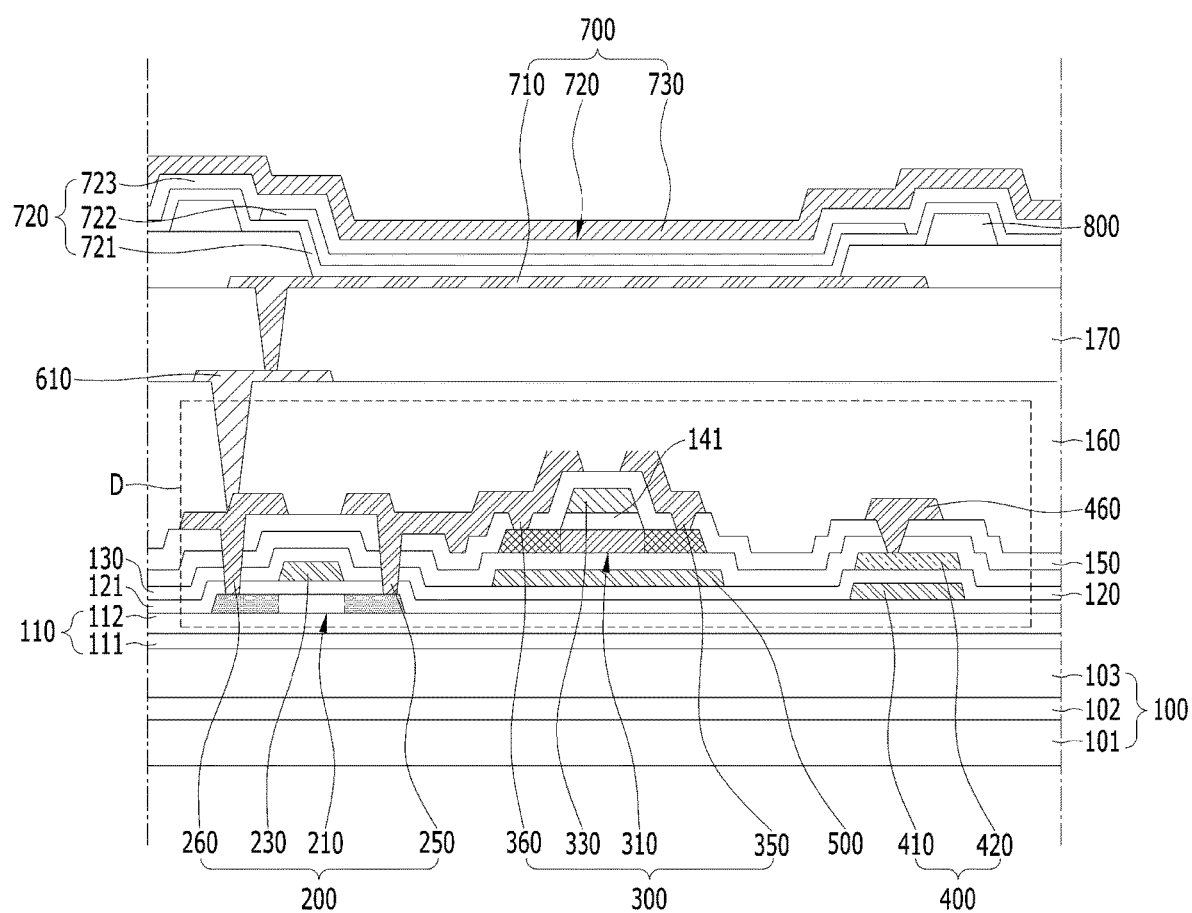
FIGS. 11A and 11B are views showing the display apparatus according to another embodiment of the present disclosure.
Figure 11B:
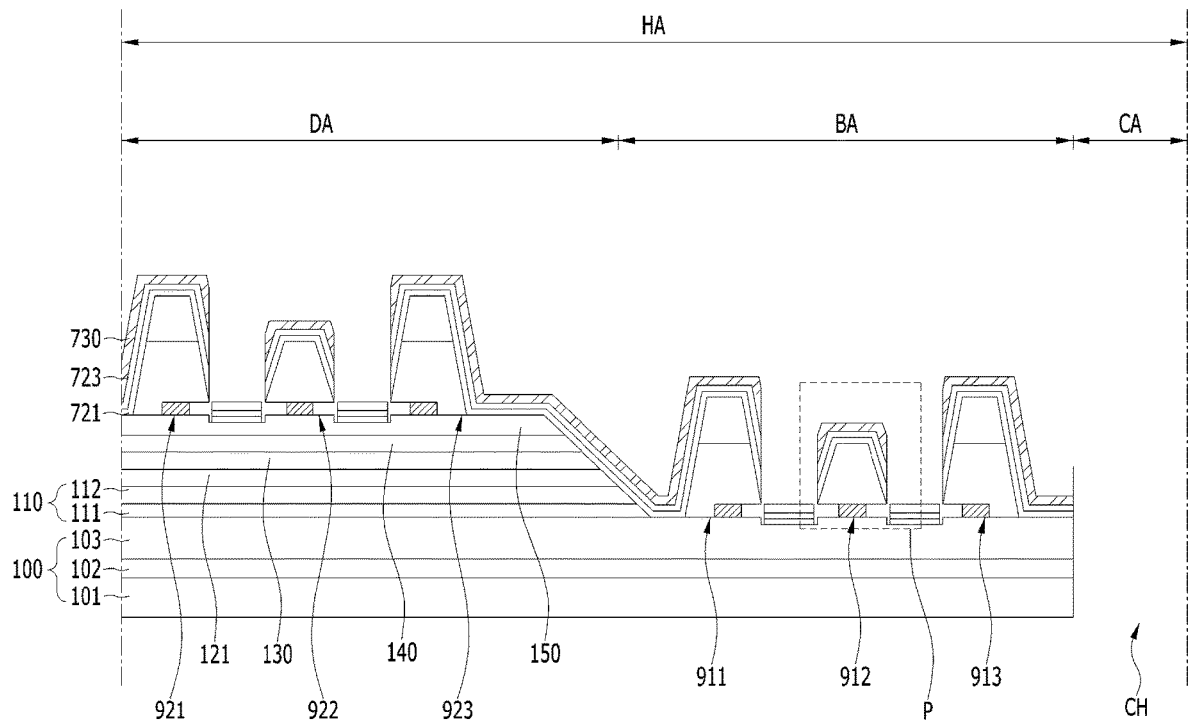
Figure 12:
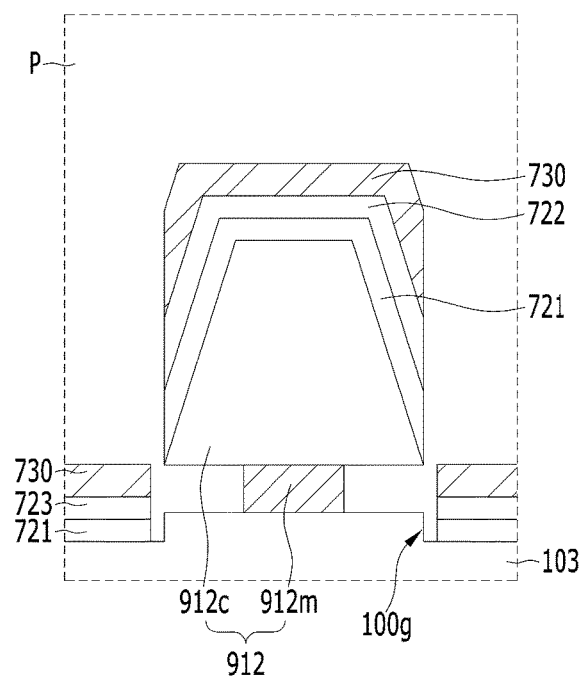
FIG. 12 is an enlarged view of P in FIG. 11B according to an embodiment of the present disclosure.

As shown in FIGS. 11A and 11B, the method of forming the display apparatus according to the embodiment of the present disclosure may include a step of forming the light-emitting layer 720 and the second electrode 730 of each light-emitting device 700 on the device substrate 100 in which the separating device 911, 912 and 913 and the dam 921, 922 and 923 are formed, and a step of forming the substrate hole CH in the penetrating region CA.

Accordingly, in the display apparatus according to the embodiment of the present disclosure and the method of forming the same, the insulating layers stacked on the separating region BA between the penetrating region CA in which the substrate hole CH is formed, and the pixel regions PA may be completely removed, so that the separating device 911, 912 and 913 formed on the separating region BA by a subsequent process may be in contact with the device substrate 100. Thus, in the display apparatus according to the embodiment of the present disclosure and the method of forming the same, the crack which occurs in the inorganic insulating layer by a process of forming the substrate hole may not propagate to the pixel regions PA. Thereby, in the display apparatus according to the embodiment of the present disclosure and the method of forming the same, the permeation of the external moisture due to a process of forming the substrate hole may be blocked, and the damage of the light-emitting devices due to the external moisture may be prevented.

And, in the display apparatus according to the embodiment of the present disclosure and the method of forming the same, the separating device 911, 912 and 913 may be formed simultaneously with the dam 921, 922 and 923. Therefore, in the display apparatus according to the embodiment of the present disclosure and the method of forming the same, process efficiency may be improved.

The display apparatus according to the embodiment of the present disclosure is described that the device substrate 100 is a single layer. However, in the display apparatus according to another embodiment of the present disclosure, the device substrate 100 may have a multi-layer structure. For example, in the display apparatus according to another embodiment of the present disclosure, the device substrate 100 may have a structure in which an insulating layer 102 may be disposed between the first substrate layer 101 and the second substrate layer 103, as shown in FIGS. 11A and 11B. The second substrate layer 103 may include the same material as the first substrate layer 101. For example, the first substrate layer 101 and the second substrate layer 103 may include plastic. The insulating layer 102 may include an insulating material. Thus, in the display apparatus according to another embodiment of the present disclosure, the device substrate 100 may include a recess groove 100g disposed adjacent the separating device 911, 912 and 913.

Figure 13A:
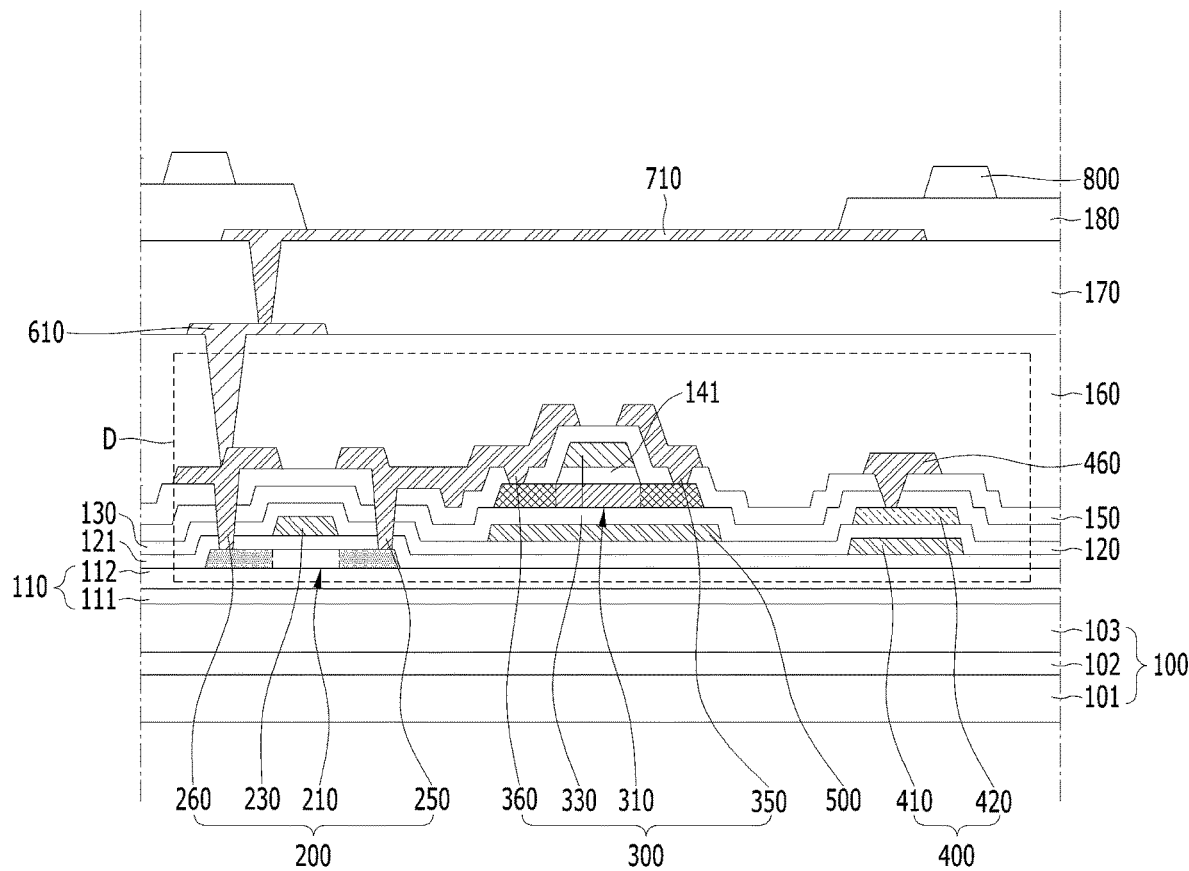
FIGS. 13A and 13B are views sequentially showing a process of forming the display apparatus according to another embodiment of the present disclosure.
Figure 13B:
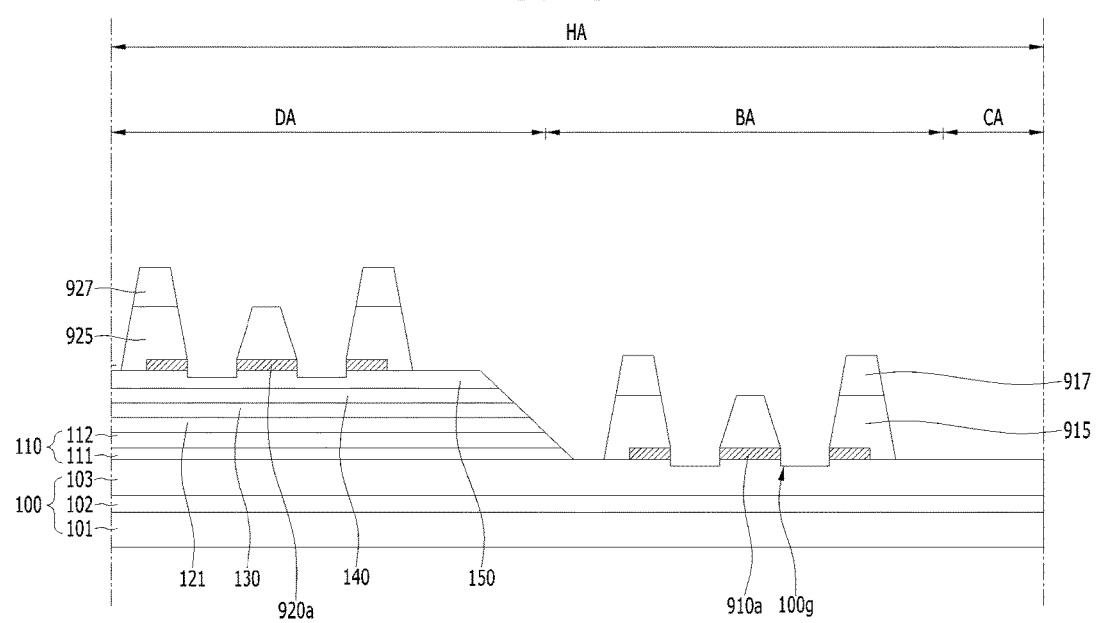

FIGS. 13A and 13B are views sequentially showing a method of forming the display apparatus according to another embodiment of the present disclosure.

As shown in FIGS. 13A and 13B, in the method of forming the display apparatus according to another embodiment of the present disclosure, an over-etching may occur in a process of forming the first preliminary metal pattern 910a. Thus, in the method of forming the display apparatus according to another embodiment of the present disclosure, a portion of the device substrate 100 exposed by the first preliminary cap 915 may be etched, so that the recess groove 100g may be formed.

The step of forming the first preliminary metal pattern 910a may be performed simultaneously with the step of forming the second preliminary metal pattern 920a. For example, a portion of the upper interlayer insulating layer 150 exposed by the second preliminary cap 925 may be over-etched in the step of forming the second preliminary metal pattern 920a.

That is, the display apparatus according to another embodiment of the present disclosure may include the recess groove 100g in a portion of the device substrate 100 which is formed by the step of forming the separating device 911, 912 and 913. Thus, in the display apparatus according to another embodiment of the present disclosure, the moving path of the external moisture permeated through the substrate hole CH formed in the penetrating hole CA may be increased. Thereby, in the display apparatus according to another embodiment of the present disclosure, the deterioration of the light-emitting devices due to the permeation of the external moisture may be effectively prevented.

In the result, the display apparatus according to the embodiments of the present invention may include the separating device between the substrate hole and the light-emitting devices, wherein the separating device may be in contact with the device substrate. Thus, in the display apparatus according to the embodiments of the present disclosure, the crack which occurs in the inorganic insulating layer in a process of forming the substrate hole may be blocked by the separating device. Thereby, in the display apparatus according to the embodiments of the present disclosure, the reliability of the light-emitting devices may be improved.

What is claimed is:

1. A display apparatus comprising:
   a substrate hole penetrating a device substrate;
   a light-emitting device on the device substrate, the light-emitting device spaced away from the substrate hole;
   a plurality of inorganic insulating layers between the device substrate and the light-emitting device;
   a separating device disposed laterally between the plurality of inorganic insulating layers and the substrate hole;
   a dam on the plurality of inorganic insulating layers, the dam disposed laterally between the light-emitting device and the separating device, the dam including a first metal pattern and a first insulating cap disposed on the first metal pattern; and
   a first over-coat layer between the plurality of inorganic insulating layers and the light-emitting device, wherein the dam, the separating device and the substrate hole are laterally spaced apart from the first over-coat layer, and
   a driving circuit a transistor including at least one thin film transistor and an intermediate electrode which electrically connects the light-emitting device to the driving circuit through a first contact hole penetrating the first over-coat layer,
   wherein the plurality of inorganic insulating layers includes at least one gate insulating layer of the at least one transistor,
   wherein the separating device includes a second metal pattern being in direct contact with the device substrate, and a second insulating cap disposed on the second metal pattern,
   wherein a side surface of each of the plurality of inorganic insulating layers toward the separating device has a gentler slope than a side surface of the separating device and a side surface of the dam, such that an angle between a side surface of the plurality of inorganic insulating layers toward the separating device and an upper surface of the device substrate is smaller than an angle between a side surface of the first insulating cap of the dam toward the separating device and the upper surface of the device substrate and an angle between a side surface of the second insulating cap of the separating device toward the dam and the upper surface of the device substrate, and
   wherein the first metal pattern and the second metal pattern are patterned from a same layer as the intermediate electrode.

2. The display apparatus according to claim 1, wherein the device substrate includes a recess groove disposed adjacent the separating device, and wherein the separating device is spaced apart from the recess groove of the device substrate.

3. The display apparatus according to claim 2, wherein the recess groove of the device substrate has a thickness thinner than a portion of the device substrate overlapping with the separating device.

4. The display apparatus according to claim 1, wherein the first metal pattern overlaps with the first insulating cap and has a smaller width than the first insulating cap, and
   wherein the second metal pattern overlaps with the second insulating cap and has a smaller width than the second insulating cap.

5. The display apparatus according to claim 4, wherein at least one organic layer of the light-emitting device are cut off by the separating device and the dam.

6. The display apparatus according to claim 4, wherein the second metal pattern includes a same material as the first metal pattern, and
   wherein the second insulating cap includes a same material as the first insulating cap.

7. The display apparatus according to claim 6, wherein the dam has a same stacked structure as the separating device.

8. The display apparatus according to claim 1, wherein the side surface of the plurality of inorganic insulating layers toward the separating device is disposed between the dam and the separating device.

9. The display apparatus according to claim 1, wherein the first metal pattern is in contact with the plurality of inorganic insulating layers.

10. The display apparatus according to claim 1, further comprising:
    second over-coat layer disposed between the first over-coat layer and the light-emitting device; and
    a connecting electrode disposed between the first over-coat layer and the second over-coat layer, the connecting electrode connected to the light-emitting device through a contact hole penetrating the second over-coat layer,
    wherein the first metal pattern and the second metal pattern include a same material as the connecting electrode.

11. The display apparatus according to claim 10, wherein the first insulating cap and the second insulating cap include a same material as the second over-coat layer covering the connecting electrode.

12. The display apparatus according to claim 1, further comprising a first thin film transistor and a second thin film transistor disposed between the device substrate and the first over-coat layer, wherein a second semiconductor pattern of the second thin film transistor is disposed on a different layer from a first semiconductor pattern of the first thin film transistor, and wherein the second semiconductor pattern includes a different material from the first semiconductor pattern.

13. The display apparatus according to claim 12, wherein the first semiconductor pattern includes a low-temperature poly silicon (LTPS), and wherein the second semiconductor pattern includes an oxide semiconductor.

14. The display apparatus according to claim 12, wherein the plurality of inorganic insulating layers includes a first gate insulating layer, a second gate insulating layer on the first gate insulating layer, and an intermediate interlayer insulating layer, wherein the first gate insulating layer is disposed between the first semiconductor pattern and a first gate electrode of the first thin film transistor, wherein the second gate insulating layer is disposed between the second semiconductor pattern and a second gate electrode of the second thin film transistor, and wherein both ends of the first gate insulating layer or the second gate insulating layer are disposed on the second semiconductor pattern.

15. The display apparatus according to claim 12, further comprising a storage capacitor disposed between the device substrate and the first over-coat layer, wherein the storage capacitor includes a storage electrodes disposed on a same layer as a first gate electrode of the first thin film transistor.

16. The display apparatus according to claim 15, further comprising a light-blocking electrode disposed between the device substrate and the second semiconductor pattern of the second thin film transistor, wherein the storage capacitor includes a storage electrodes disposed on a same layer as the light-blocking electrode.

* * * * *